(12) United States Patent
Inuzuka

(10) Patent No.: US 6,191,488 B1
(45) Date of Patent: Feb. 20, 2001

(54) FLIP CHIP TYPE SEMICONDUCTOR PACKAGE AND METHOD OF INJECTING RESIN INTO DEVICE THEREOF

(75) Inventor: Tadashi Inuzuka, Tokyo (JP)

(73) Assignee: Oki Electric Industry Co., Ltd., Tokyo (JP)

( * ) Notice: Under 35 U.S.C. 154(b), the term of this patent shall be extended for 0 days.

(21) Appl. No.: 09/412,637

(22) Filed: Oct. 5, 1999

(30) Foreign Application Priority Data

Oct. 6, 1998 (JP) .................................................. 10-284059

(51) Int. Cl.[7] .................................................... H01L 23/48
(52) U.S. Cl. ........................... 257/778; 257/737; 438/108
(58) Field of Search ................................... 257/778, 777, 257/737, 738, 783; 438/108, 613

(56) References Cited

U.S. PATENT DOCUMENTS 5,818,113 * 10/1998 Iseki et al. .......................... 257/778

FOREIGN PATENT DOCUMENTS 7-302858 * 11/1995 (JP) .

* cited by examiner

Primary Examiner—Roy Potter
(74) Attorney, Agent, or Firm—Rabin & Champagne, P.C.

(57) ABSTRACT

A semiconductor package including a sealing resin between a substrate and a semiconductor chip, wherein a concavity portion is defined in the surface of the substrate. The concavity facilitates spreading of the resin when the latter is injected between the substrate and the chip to connect them in a sealed manner.

19 Claims, 3 Drawing Sheets

FLIP CHIP TYPE SEMICONDUCTOR PACKAGE AND METHOD OF INJECTING RESIN INTO DEVICE THEREOF

BACKGROUND OF THE INVENTION

1. Field of the Invention

This invention relates to a semiconductor package and a method of injecting a resin into the semiconductor package. This invention relates particularly to a flip chip type semiconductor package wherein a semiconductor chip is implemented on a substrate in face-down form.

2. Description of the Related Art

A semiconductor package of a type wherein a semiconductor chip is implemented on the surface of a circuit substrate and a connecting portion between the two is sealed with a resin or the like, has been disclosed in Japanese Patent Application Laid-Open No. Hei 7-302858 which was opened to the public by Japanese Patent Office in Nov. 14, 1995.

In this type of semiconductor package, a sealing resin is injected or poured between a circuit substrate and a semiconductor chip through the use of by capillary action so as to seal between the substrate and the chip as has been described in the paragraph [0023] on page 4 in the aforementioned publication.

Since the clearance or gap between the circuit substrate and the semiconductor chip is normally very narrow as in a range of 40 to 60 μm, the injected resin is hard to spread.

Since there has recently been a growing demand for a reduction in the thickness of this type of semiconductor package, such a clearance has the potential for becoming narrower. In such a case, it is considered that the resin will be increasingly harder to spread and a long time will be required for the resin to spread through the entire gap between the substrate and the chip.

SUMMARY OF THE INVENTION

With the foregoing in view, it is therefore an object of the present invention to provide a semiconductor package which makes it possible to facilitate spreading of a sealing resin when the sealing resin is formed between a substrate and a semiconductor chip.

It is another object of the present invention to provide a method of injecting a sealing resin, which is capable of forming the sealing resin between a substrate and a semiconductor chip uniformly.

In order to achieve the above objects, a typical invention of the present application provides a structure of a semiconductor package comprising a substrate, a semiconductor chip and a resin for sealing between the substrate and the semiconductor chip and wherein a concave portion is defined in the surface of the substrate.

Further, another typical invention provides a resin injecting method suitable for use in a semiconductor package, comprising the steps of placing a square semiconductor chip above the substrate and thereafter injecting the resin between the semiconductor chip and the substrate simultaneously from substantially the centers of each of three sides of the semiconductor chip.

According to the semiconductor package structure of the present invention, since a sufficient clearance can be ensured between the substrate and the semiconductor chip because the concave portion is defined in the surface of the substrate, the injected resin is easily spread.

According to the resin injecting method of the present invention, since the resin is injected substantially simultaneously substantially from the centers of the three sides of the square semiconductor chip, the resin can be injected between the substrate and the semiconductor chip uniformly and within a short time.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings. In the following description, portions of the embodiments directly associated with the present invention will be A first embodiment will first be explained with reference to FIGS. 1 and 2.

Figure 1:
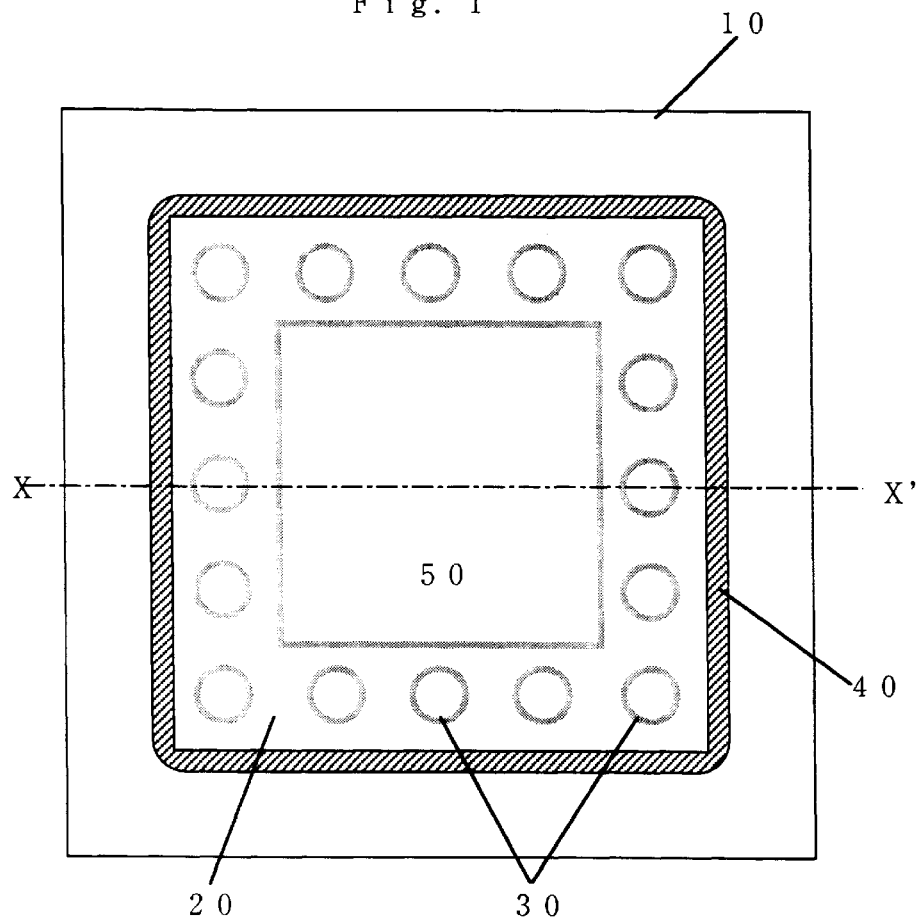
FIG. 1 is a plan view showing a first embodiment of the present invention.
Figure 2:
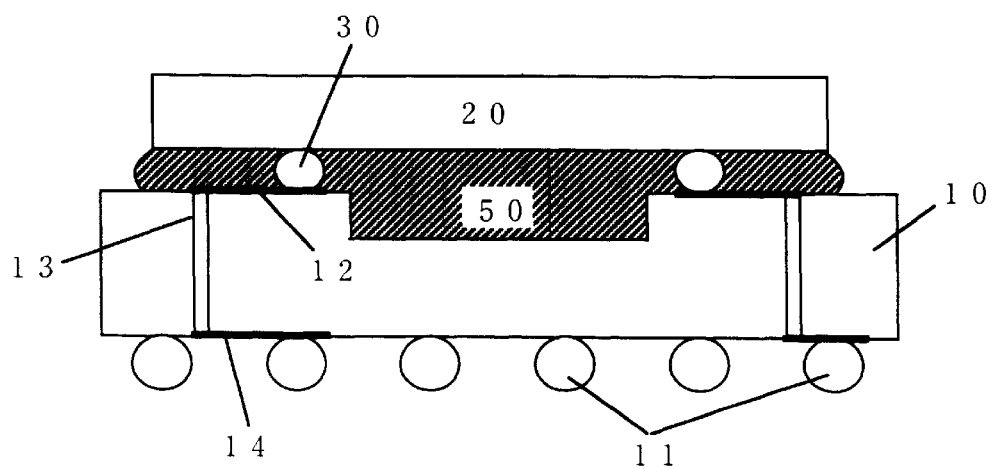
FIG. 2 is a cross-sectional view illustrating the first embodiment.

FIG. 1 is a plan view of the first embodiment of the present invention. Hidden portions are also shown by dotted lines or light lines to provide easy understanding of their description. FIG. 2 is a cross-sectional view taken along line X–X' in FIG. 1.

In the first embodiment, a semiconductor chip 20 is mounted on a package substrate 10. The two are electrically connected to each other through electrodes 30. The connected portions are sealed with a sealing resin 40.

A plurality of the electrodes 30 are formed on a circuit forming surface of the semiconductor chip 20. An electrical signal generated within the semiconductor chip 20 from a predetermined electrode of these electrodes 30, is outputted to the outside. An externally-derived electrical signal is supplied to other electrodes. The electrodes 30 are typically formed of solder. Although the electrodes formed by ball-shaped solder are illustrated in the present embodiment, the shape and material are not necessarily limited to this. It is also considered that for example, flat electrodes other than the illustrated ball-shaped ones are utilized as the electrodes or other metal conductors are used as the electrodes without being limited to the solder.

In the package substrate 10 (which is formed with ceramic or an organic substance as a principal material), a plurality of pads 12 are provided at positions respectively corresponding to the electrodes 30. The electrodes 30 and the corresponding pads 12 are respectively electrically connected to one another.

Methods of connecting them include forming a compound between metals, using organic conductive paste, using solder, etc.

Their connecting portions are sealed with a sealing resin 40. This sealing can prevent corrosion of connecting portions and wires or interconnections, which is caused by the entry of moisture from the outside. The pads 12 are respectively electrically connected to a plurality of ball-shaped connecting portions 11 formed by solder on the back of the substrate 10, through interconnections or circuits formed on and in the substrate 10. The ball-shaped connecting portions 11 are used for connection to a device such as an external substrate or the like.

While the ball-shaped connecting portions can be confirmed illustrated only with the cross-sectional view of FIG. 2 to provide easy understanding of description herein, a large number of ball-shaped connecting portions are actually placed over the back of the substrate 10 in array form.

In the present embodiment, the pads 12 placed on the surface of the package substrate 10 and the pads 14 placed on the back of the package substrate 10 are respectively electrically connected to one another via through holes 13. The ball-shaped connecting portions 11 are electrically connected to the pads 14.

The through holes 13 are configured so as to have conductivity. For example, metal layers are respectively formed on the inner surfaces of the through holes 13 by plating or the like so as to provide their conductivity. If the through holes are defined so as to have conductivity by a process other than the plating, then they perform their conductive functions. Namely, a designer may suitably select a configuration wherein the interconnections formed on the surface of the substrate and the interconnections formed on the back thereof are electrically connected to one another.

In the first embodiment of the present invention, a concavity 50 is defined in the central portion of the package substrate 10. The concavity 50 is defined in the surface of the substrate 10 on the inner side as viewed from an area in which the pads 12 are formed. Although a the concavity 50 is square in the view shown in FIG. 1 for the first embodiment, the shape of the concavity may be suitably selected by the designer according to the placement of the electrodes 30 of the semiconductor chip 20.

It is considered that the position where the concavity 50 is defined, can be diversely changed according to the placement of the electrodes of the semiconductor chip. When the electrodes of the semiconductor chip are placed as in the present embodiment, it is optimal that the concavity be defined in the central portion of the substrate on the inner side as viewed from a peripheral area in which the electrodes are placed.

The concavity 50 is defined by a known engraving technique. The designer can arbitrarily set the depth of the concavity 50 according to the thickness of the substrate. Since the concavity 50 is defined in the central portion of the package substrate 10, the distance to the chip from the base or bottom of the concavity 50 is greater than the distance between the semiconductor chip 20 and the substrate 10 in the substrate's peripheral area in which the electrodes 30 of the semiconductor chip 20 and the pads 12 are connected to one another.

A method of injecting the sealing resin 40 between the semiconductor chip 20 and the package substrate 10 will now be described.

When the sealing resin 40 is injected therebetween, an epoxy resin having low viscosity is dropped onto the package substrate 10 at the peripheral portion of the semiconductor chip 20. At this time, the package substrate 10 is heated at 60–100° C. The dropped resin is charged between the semiconductor chip 20 and the package substrate 10 by capillary action.

In this case, the resin is charged between the semiconductor chip 20 and the package substrate 10 and the resin is formed even under the periphery of the semiconductor chip 20 so as to protrude from its periphery.

Thereafter, the charged resin is cured (solidified) under heat to thereby obtain such a resin or plastic molded structure as shown in FIGS. 1 and 2.

Since the concavity 50 is provided in the present embodiment, the gap or clearance between the substrate 10 and the semiconductor chip 20 becomes large so that the injected resin is easy to expand or spread. Since the resin is easily spread, a resin sealing process can be realized in a short time as compared with the prior process. This will bring about a very large effect for a manufacturer for fabricating this type of semiconductor device in mass production.

Further, since the concavity 50 is provided in the central portion of the substrate 10, the resin is smoothly spread even in the substrate's central portion wherein, until the present invention the resin was hard to spread up to now. The smooth charging of the resin is considered to suppress problems about non-charging of the resin, etc., with the result that the invention is considered to be able to contribute to an improvement in device's reliability.

The aforementioned embodiment is an example in which the concavity 50 is defined by engraving the package substrate 10. A second embodiment of the present invention wherein this package substrate is formed by bonding two substrates together, will next be explained.

Figure 3:
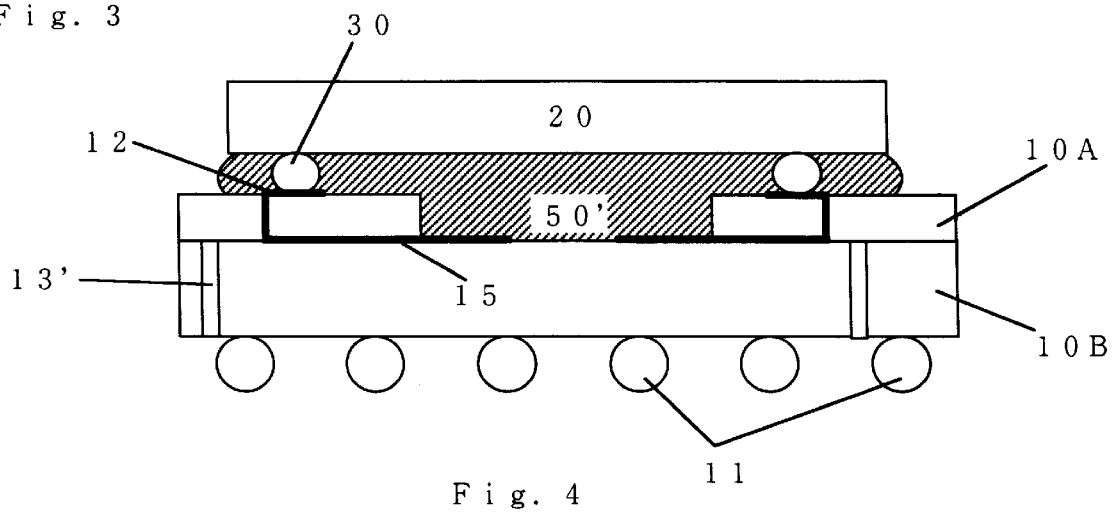
FIG. 3 is a plan view depicting a second embodiment of the present invention.
Figure 4:
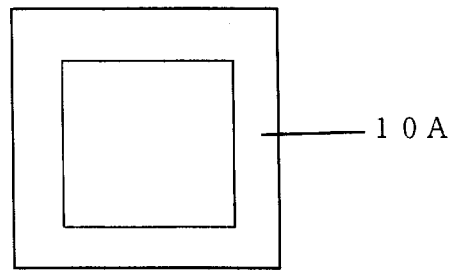
FIG. 4 is a plan view of a substrate 10A employed in the second embodiment.

FIG. 3 shows an example in which a substrate 10' is comprised of a substrate 10A and a substrate 10B. The substrate 10A is one whose central portion is hollow, as shown in FIG. 4. The bonding of such substrates 10A and 10B together allows implementation of a structure in which a concave portion 50' is provided in the central portion of the substrate 10' in a manner similar to the first embodiment.

Pads 12, electrically connected to electrodes 30 of a semiconductor chip 20, are formed in the substrate 10A. The pads 12 are respectively electrically connected to wires or interconnections 15 formed on the substrate 10B via such through holes as mentioned above or interconnections formed in the substrate 10A. The interconnections 15 are electrically connected to ball-shaped connecting portions 11 via through holes 13' defined in the substrate 10B.

An advantageous effect similar to that obtained by the first embodiment can be brought about in that if the sealing resin 40 is injected into such a structure by a method similar to the above, then the sealing resin 40 is easily spread between the substrate 10' and the semiconductor chip 20 in a manner similar to the first embodiment.

Further, the a present embodiment can implement the substrate having a function similar to the substrate employed in the first embodiment by the method of simply bonding the two substrates together.

Figure 5:
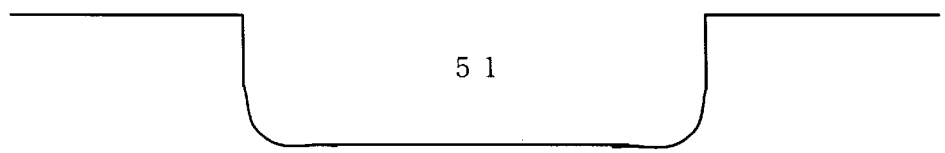
FIG. 5 is a cross-sectional view showing another example of a substrate having a concave form.
Figure 6:
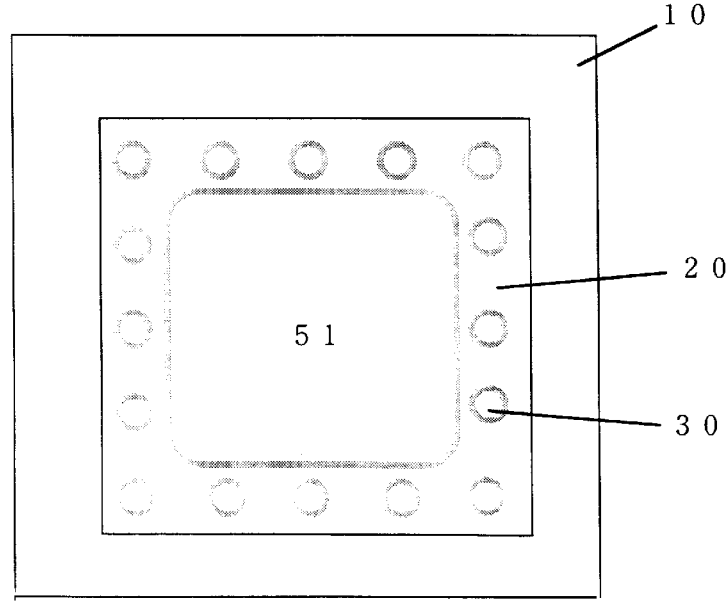
FIG. 6 is a plan view illustrating another example shown in FIG. 5.

In the concavities 50 and 50' employed in the first and second embodiments, the bottoms of the concavities are vertically shaped. However, if a concavity 51 whose bottom is shaped in the form of a gentle taper, is used as shown in FIGS. 5 and 6, then the resin is smoothly charged even into the corners of the concavity 51 upon injection of the resin. FIG. 5 is an enlarged cross-sectional view of the concavity 51, and FIG. 6 is a plan view.

Figure 7:
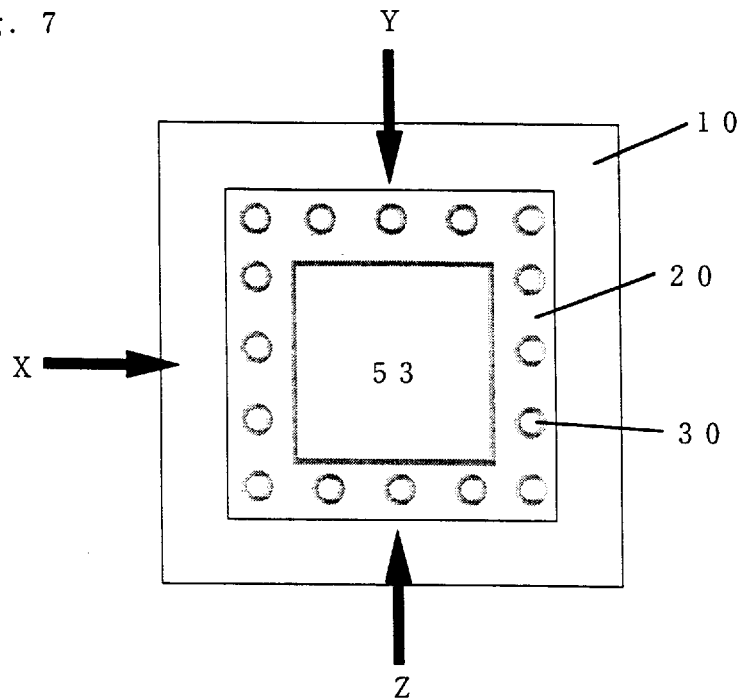
FIG. 7 is a cross-sectional view depicting a third embodiment of the present invention.

A third embodiment of the present invention will next be described with reference to FIGS. 7 and 8. The present embodiment is identical in basic structure to the first embodiment. The same parts as those illustrated in the first embodiment are identified by the same reference numerals and their description will therefore be omitted.

The present embodiment has a configuration characterized by a bottom portion of a concave portion 53 having a slope or inclination of an angle θ. A designer can selectively set the angle θ from the thickness of a substrate 10, the depth of the deepest portion of the concave portion 53, and the viscosity of a resin. This inclination is formed using a known engraving technique.

If the sealing resin 40 is injected from an X direction above the inclination where the sealing resin 40 is injected into this structure, then the resin is easily spread from above to below the inclination, i.e., over the entire surface between the substrate 10 and a chip. This is considered to result from the fact that pressure is applied to the resin through the slope so that the resin becomes easy to flow. It is desirable in this case that the resin injected from the X direction is injected from the central portion of the side of the semiconductor chip.

Figure 8:
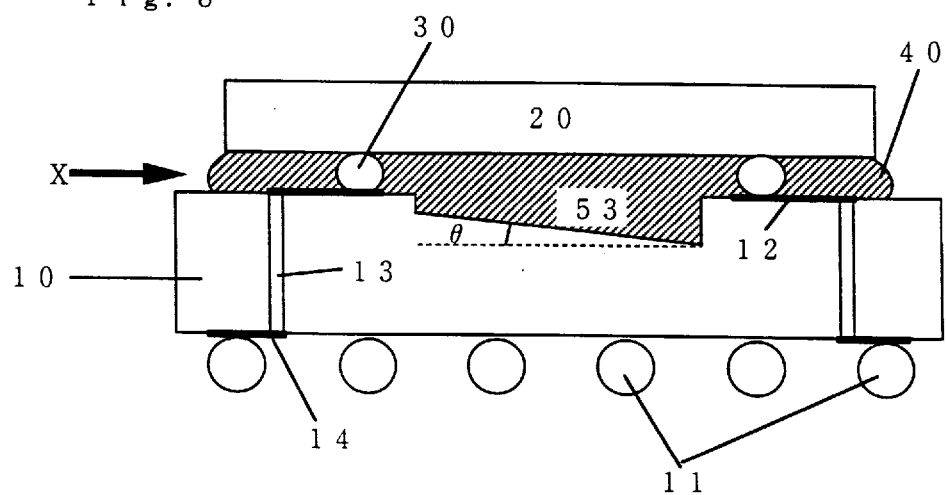
FIG. 8 is a plan view showing the third embodiment.

Further, if the resin is injected from the central portions (Y and Z directions) of the two adjacent sides of the semiconductor chip as well as from the X direction above the inclination as shown in FIG. 8, then the resin can spread out faster.

Figure 9:
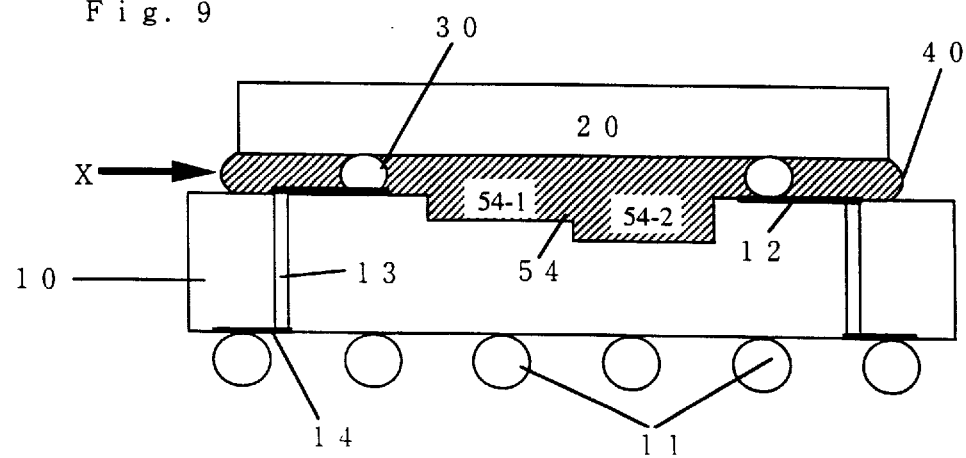
FIG. 9 is a cross-sectional view illustrating a further example of a substrate having a concave shape.

In addition, the inclination may be shaped in stepwise form as shown in FIG. 9. Namely, such a structure with a concavity 54 has bottom sides such as bottom sides 54-1 and 54-2, which stand on different levels or are offset.

If a resin is injected from an X direction above an inclination even in this case, then the resin is easy to spread from above to below the inclination, i.e., over the entire surface between a substrate and a chip.

According to the various embodiments of the present invention, as has been described above, a package structure in which a resin is easy to spread, can be implemented, and the resin can be also injected in a short time.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:
   a substrate having interconnections formed on a principal surface, the interconnections including a plurality of connecting portions, and a plurality of external connecting terminals formed on another principal surface, the external connecting terminals being electrically connected to the interconnections through a plurality of through holes;
   a semiconductor chip having a plurality of input/output terminals, said semiconductor chip mounted on the principal surface of the substrate so that the input/output terminals are connected to the interconnections; and
   a sealing material for sealing between said substrate and said semiconductor chip;
   wherein a concave portion is defined in the principal surface of said substrate and said sealing material is charged within the concave portion.

2. The semiconductor device according to claim 1, wherein said concave portion has a bottom with an inclination.

3. The semiconductor device according to claim 2, wherein the inclination is shaped stepwise.

4. A resin injecting method suitable for use in the semiconductor device as claimed in claim 1, comprising the steps of:
   placing the semiconductor chip shaped in square form above the substrate upon formation of the sealing material in the semiconductor device; and
   thereafter injecting the sealing material between the semiconductor chip and the substrate simultaneously substantially from the centers of the three sides of the semiconductor chip.

5. A resin injecting method suitable for use in the semiconductor package as claimed in claim 2, comprising the steps of:
   placing the semiconductor chip above the substrate upon formation of the sealing material in the semiconductor device; and
   thereafter injecting the sealing material between the semiconductor chip and the substrate from the side above the inclination.

6. The semiconductor device according to claim 1, wherein the corners lying within the concave portion are taper-shaped.

7. A semiconductor device comprising:
   a substrate having a main surface and a back surface, said substrate having a concave portion in a central area of said main surface, said substrate including a plurality of pads formed in a peripheral area of said main surface, a plurality of connecting portions of said substrate being formed on said back surface, and a plurality of conductive portions respectively electrically connecting the connecting portions to the pads;
   a semiconductor chip having a plurality of electrodes each outputting an electric signal, said semiconductor chip being formed on said main surface of said substrate, wherein said electrodes are respectively electrically connected to said pads of said substrate; and
   a sealing resin provided between said substrate and said semiconductor chip so that said sealing resin covers said electrodes, said pads and said concave portion of said substrate.

8. The semiconductor device according to claim 7, wherein said concave portion has an inclined bottom.

9. The semiconductor device according to claim 7, wherein said concave portion has a step on a bottom thereof.

10. The semiconductor device according to claim 7, wherein said concave portion has a gentle taper at a peripheral bottom thereof.

11. The semiconductor device according to claim 7, wherein said conductive portions are formed in respective through holes formed in said substrate.

12. A method of manufacturing a semiconductor device comprising the steps of:
   providing a semiconductor chip having a plurality of electrodes;

providing a substrate having a main surface and a back surface, including forming the substrate with a concave portion in a central area of the main surface, a plurality of pads in a peripheral area of the main surface, a plurality of connecting portions on the back surface, and a plurality of conductive portions respectively electrically connecting the connecting portions to the pads;

mounting the chip on the substrate main surface, including respectively connecting the electrodes to the pads; and injecting a sealing material between the substrate and the chip so that the sealing material covers the electrodes, the pads and the concave portion of the substrate.

13. The method of manufacturing a semiconductor device according to claim 12, wherein said providing a substrate includes forming the concave portion with a shallow bottom at a first side and a deep bottom at a second side.

14. The method of manufacturing a semiconductor device according to claim 13, wherein said injecting a sealing material includes injecting the sealing material from the first side, between the semiconductor chip and the substrate.

15. The method of manufacturing a semiconductor device according to claim 13, wherein said injecting a sealing material includes injecting the sealing material between the semiconductor chip and the substrate simultaneously from the first side and from two directions perpendicular to the first side.

16. The method of manufacturing a semiconductor device according to claim 13, including forming the concave portion with a step on a bottom thereof.

17. The method of manufacturing a semiconductor device according to claim 13, including forming the concave portion with bottom inclined from the first side to the second side.

18. The method of manufacturing a semiconductor device according to claim 12, including forming the concave portion with a gentle taper at a peripheral bottom thereof.

19. The method of manufacturing a semiconductor device according to claim 12, including forming through holes in the substrate and forming the conductive portions in the through holes.

* * * * *